(12) United States Patent
Jeon et al.

(10) Patent No.: US 11,670,657 B2
(45) Date of Patent: Jun. 6, 2023

(54) IMAGE SENSOR INCLUDING FENCE STRUCTURE DISPOSED LATERALLY OF COLOR FILTERS

(71) Applicant: SAMSUNG ELECTRONICS CO., LTD., Suwon-si (KR)

(72) Inventors: Min Hwan Jeon, Hwaseong-si (KR); Doo Won Kwon, Seongnam-si (KR); Chan Ho Park, Hwaseong-si (KR); Kyung Rae Byun, Seoul (KR); Dong-Chul Lee, Hwaseong-si (KR); Chong Kwang Chang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 149 days.

(21) Appl. No.: 17/003,224

(22) Filed: Aug. 26, 2020

(65) Prior Publication Data
US 2021/0126028 A1  Apr. 29, 2021

(30) Foreign Application Priority Data
Oct. 23, 2019  (KR) .................. 10-2019-0131874

(51) Int. Cl.
*H01L 27/146* (2006.01)
*H04N 23/10* (2023.01)

(52) U.S. Cl.
CPC .... *H01L 27/14621* (2013.01); *H01L 27/1463* (2013.01); *H01L 27/14603* (2013.01); *H01L 27/14609* (2013.01); *H01L 27/14627* (2013.01); *H01L 27/14643* (2013.01); *H01L 27/14685* (2013.01); *H04N 23/10* (2023.01)

(58) Field of Classification Search
CPC ......... H01L 27/14621; H01L 27/14603; H01L 27/14627; H01L 27/14643; H01L 27/14685; H01L 27/1463; H01L 27/14609; H04N 9/045

See application file for complete search history.

(56) References Cited

U.S. PATENT DOCUMENTS

| | | |
|---|---|---|
| 8,766,386 B2 | 7/2014 | Tsuji |
| 9,276,029 B1 | 3/2016 | Lu et al. |
| 9,564,468 B2 | 2/2017 | Chou et al. |
| 10,063,816 B2 | 8/2018 | Yorikado |
| 10,304,885 B1 | 5/2019 | Chu et al. |
| 10,319,770 B2 | 6/2019 | Suzuki |
| 2014/0339606 A1* | 11/2014 | Lin .................. H01L 27/14621 438/70 |
| 2016/0352983 A1* | 12/2016 | Boettiger .......... H01L 27/14685 |
| 2018/0026060 A1 | 1/2018 | Suzuki |

(Continued)

FOREIGN PATENT DOCUMENTS

WO  WO-2016114154 A1 *  7/2016  ........ H01L 27/14621

*Primary Examiner* — Jennifer D Bennett
*Assistant Examiner* — Erin R Garber
(74) *Attorney, Agent, or Firm* — Volentine, Whitt & Francos, PLLC

(57) ABSTRACT

An image sensor includes; a photoelectric conversion element disposed on a substrate, a fence structure disposed on the substrate and including a low refractive index layer stacked on a barrier layer, wherein the barrier layer includes at least one metal, and a color filter disposed inwardly lateral with respect to a sidewall of the fence structure, wherein the barrier layer includes an inward lateral protrusion.

18 Claims, 21 Drawing Sheets

(56) References Cited

U.S. PATENT DOCUMENTS

| | | |
|---|---|---|
| 2018/0204961 A1 | 7/2018 | Lee |
| 2018/0277577 A1 | 9/2018 | Cheng et al. |
| 2018/0301491 A1 | 10/2018 | Nakamoto et al. |
| 2019/0067356 A1 | 2/2019 | Lin et al. |
| 2019/0123083 A1 | 4/2019 | Borthakur et al. |
| 2019/0157329 A1 | 5/2019 | Kim et al. |
| 2019/0198536 A1 | 6/2019 | Wang et al. |
| 2019/0386049 A1* | 12/2019 | Jung .................. H01L 27/1463 |
| 2021/0118930 A1* | 4/2021 | Noudo .................. H04N 25/60 |

* cited by examiner

IMAGE SENSOR INCLUDING FENCE STRUCTURE DISPOSED LATERALLY OF COLOR FILTERS

This application claims priority under 35 U.S.C. § 119 to Korean Patent Application No. 10-2019-0131874 filed on Oct. 23, 2019, the subject matter of which is hereby incorporated by reference.

BACKGROUND

1. Technical Field

The present disclosure relates to image sensors.

2. Description of the Related Art

An image sensor is an element that converts electromagnetic energy having a defined bandwidth (e.g., visible and/or infrared light, but hereafter generally, "incident light") into corresponding electrical signals. Image sensors generally include charge-coupled devices (CCD) and complementary metal oxide semiconductor (CMOS) devices. CMOS image sensors are one type of contact image sensors (CIS). CIS include a plurality of pixels arranged two-dimensional matrix, where each pixel may include a photodiode (PD) capable of converting incident light into electrical signals.

With recent developments in computer and communication fields, the demand for image sensors having improved performance has increased. This demand is particularly acute in fields related to digital cameras, camcorders, personal communication systems (PCSs), gaming consoles, security systems, medical devices, vehicles and robots.

SUMMARY

Embodiments of the present disclosure provide an image sensor in which a penetration prevention layer is formed between a low refractive index layer and a mask layer that may be used to form a fence structure having a sidewall laterally adjacent to a color filter, such that materials included in the mask layer do not penetrate the low refractive index layer.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an exemplary embodiment of the present disclosure, there is provided an image sensor including: a photoelectric conversion element disposed on a substrate, a fence structure disposed on the substrate and including a low refractive index layer stacked on a barrier layer, wherein the barrier layer includes at least one metal, and a color filter disposed inwardly lateral with respect to a sidewall of the fence structure, wherein the barrier layer includes an inward lateral protrusion.

According to an exemplary embodiment of the present disclosure, there is provided an image sensor including; a photoelectric conversion element disposed on a substrate, a fence structure disposed on the substrate and including a low refractive index layer stacked on a barrier layer, wherein the barrier layer includes at least one metal, and a color filter disposed inwardly lateral with respect to a sidewall of the fence structure, wherein the barrier layer includes a composite lateral protrusion including a first lateral protrusion and a second lateral protrusion.

According to an exemplary embodiment of the present disclosure, there is provided an image sensor including; a photoelectric conversion element disposed on a substrate, a fence structure disposed on the substrate and including a low refractive index layer stacked on a barrier layer, wherein the barrier layer includes a first barrier layer formed from a first metal and disposed on the substrate, and a second barrier layer formed from a second metal different from the first metal and disposed on the first barrier layer, and a color filter disposed inwardly lateral with respect to a sidewall of the fence structure, wherein the barrier layer includes an outward lateral recess.

BRIEF DESCRIPTION OF THE DRAWINGS

The above and other embodiments and features of the present disclosure will become more apparent upon consideration of the following embodiments with reference to the attached drawings, in which.

DETAILED DESCRIPTION

Figure 1:
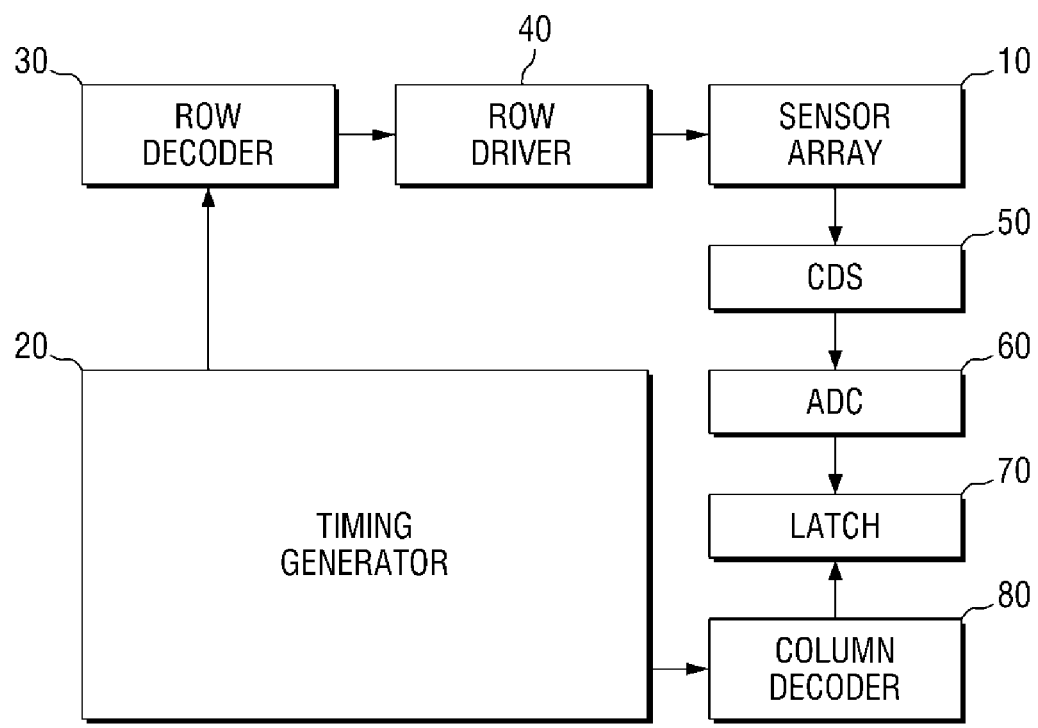
FIG. 1 is a block diagram of an image sensor according to embodiments of the present disclosure.
Figure 2:
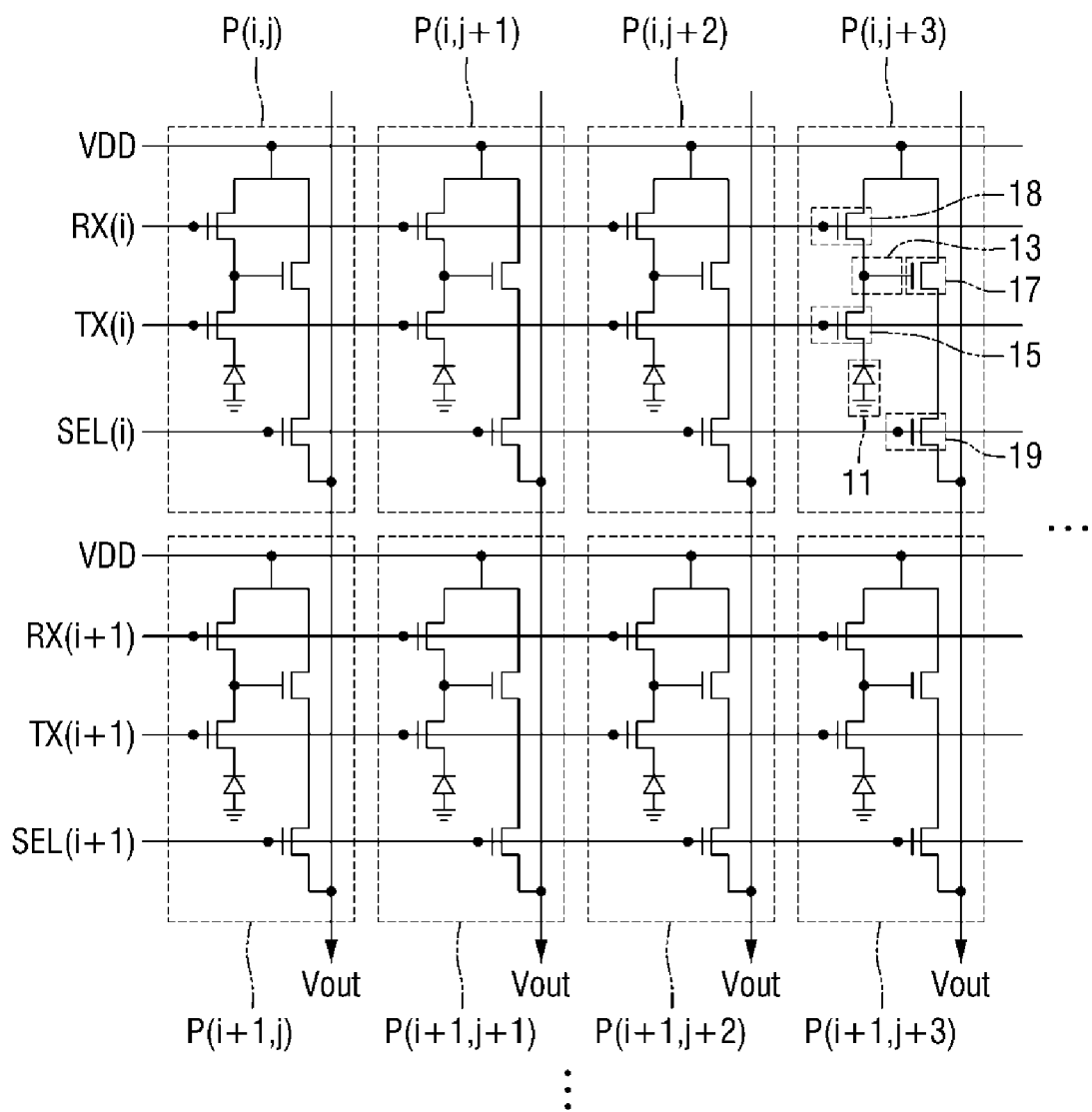
FIG. 2 is a circuit diagram further illustrating the unit pixel region of the image sensor of FIG. 1.
Figure 3:
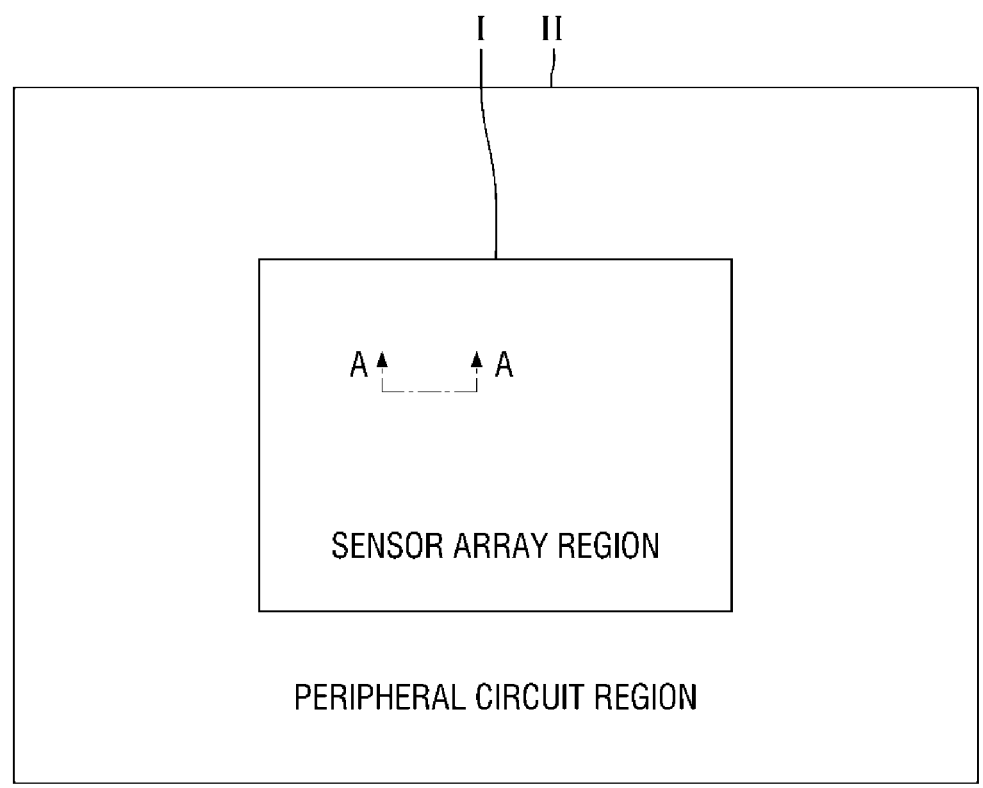
FIG. 3 is a plan view of the image sensor of FIG. 1.
Figure 3:
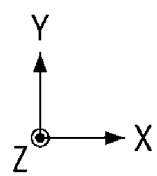
Figure 4:
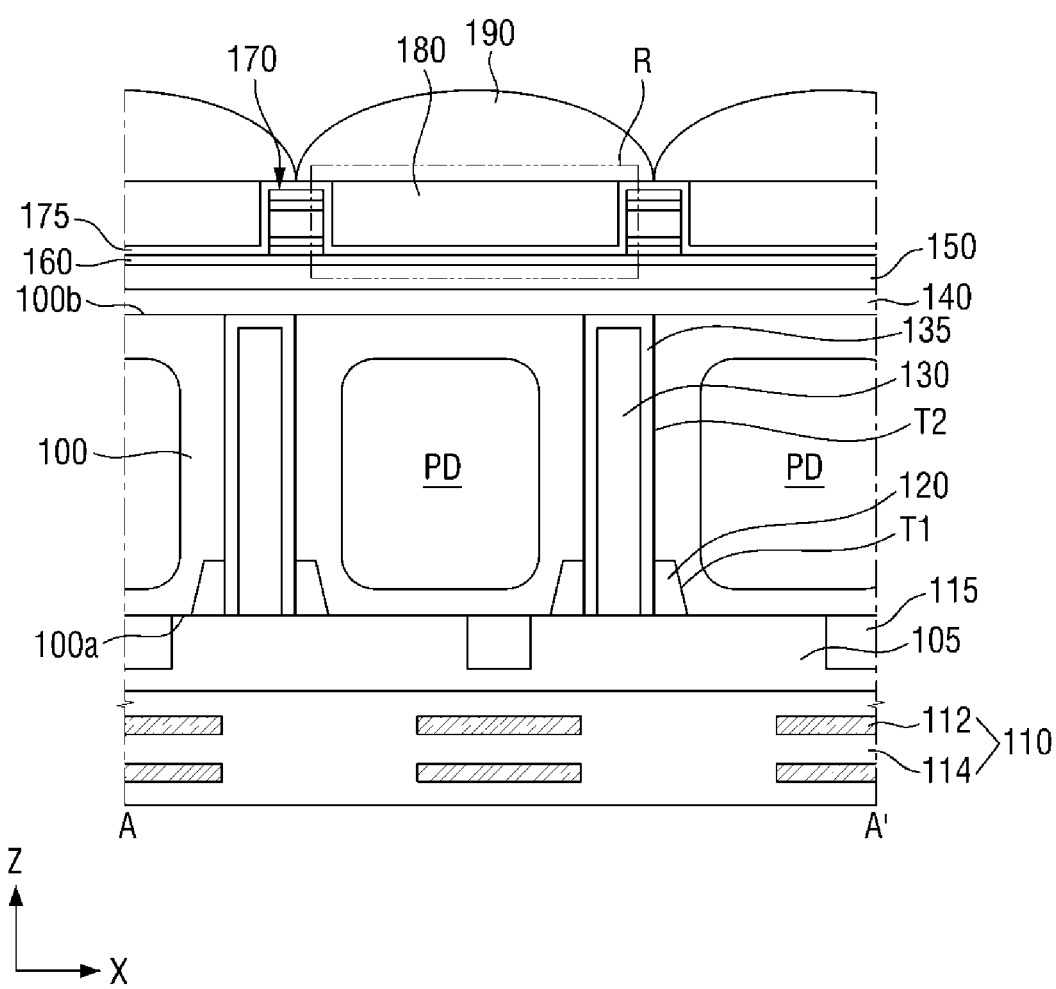
FIG. 4 is a cross-sectional view taken along line A-A' of FIG. 3.
Figure 5:
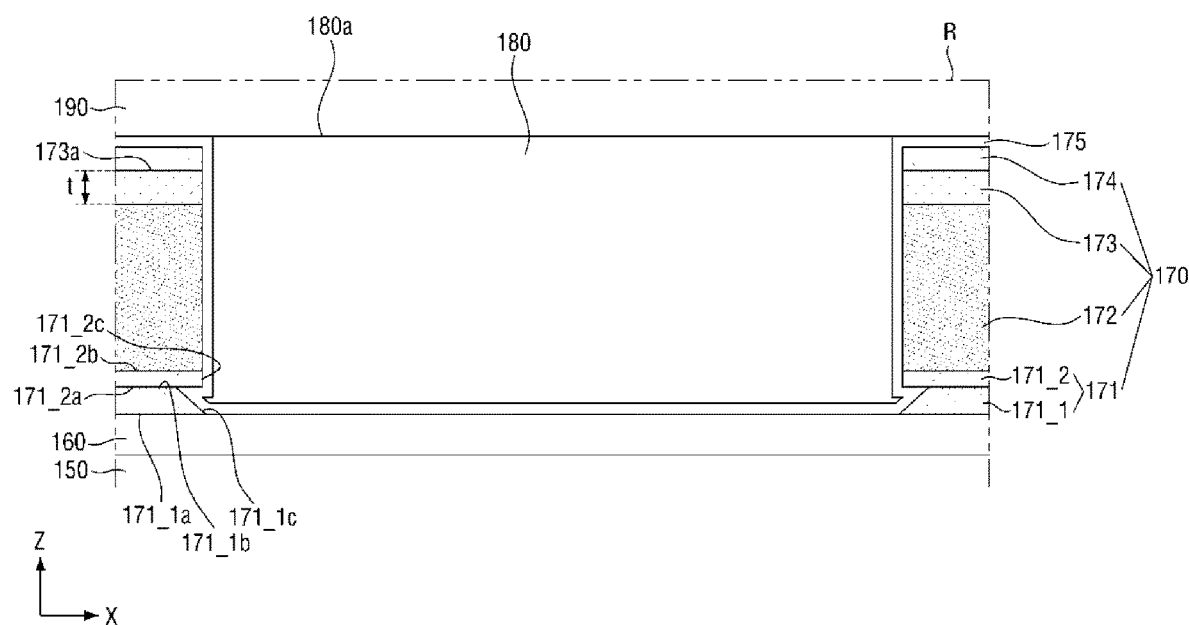
FIG. 5 is an enlarged cross-sectional view of region R of FIG. 4.

Image sensors according to embodiments of the present disclosure will be described in some additional detail with reference to FIGS. 1 through 5, where FIG. 1 is a block diagram of an image sensor; FIG. 2 is a circuit diagram further illustrating a portion of the unit pixel region 10 of the image sensor of FIG. 1; FIG. 3 is a plan view of the image sensor of FIG. 1; FIG. 4 is a cross-sectional view taken along line A-A' of FIG. 3; and FIG. 5 is an enlarged cross-sectional view illustrating a region 'R' of FIG. 4.

Referring to FIG. 1, the image sensor includes an active pixel sensor array 10, a timing generator 20, a row decoder 30, a row driver 40, a correlated double sampler (CDS) 50, an analog-to-digital converter (ADC) 60, a latch 70, and a column decoder 80.

The active pixel sensor array 10 includes a plurality of unit pixels arranged in a two-dimensional matrix (e.g., in a laterally disposed X/Y plane), wherein each unit pixel includes at least one photoelectric conversion element capable of converting incident light into an electrical signal.

The active pixel sensor array 10 may receive driving signals (e.g., a row selection signal, a reset signal, and a charge transfer signal) from the row driver 40, and operate in response to the driving signals to generate an output signal. The output signal generated by the active pixel sensor array 10 may be provided to the CDS 50 (e.g., via a vertical signal line).

The timing generator 20 may be used to provide various timing signals and/or control signals to the row decoder 30 and the column decoder 80.

The row driver 40 may provide the driving signals used to drive the unit pixels of the active pixel sensor array 10 in response to decoding performed by the row decoder 40. In a case where the unit pixels are arranged in a row/column matrix, the row driver 40 may provide the driving signals to the unit pixels on a row-by-row basis.

The CDS 50 may receive the output signal provided by the active pixel sensor array 10 (e.g., via a vertical signal line) and may hold and sample the received signal. That is, the CDS 50 may double-sample a particular noise level and the signal level of the output signal of the active pixel sensor array 10 and output a difference between the noise level and the signal level of the output signal of the active pixel sensor array 10.

The ADC 60 may convert an analog signal corresponding to the difference between the noise level and the signal level of the output signal of the active pixel sensor array 10 into a digital signal.

The latch 70 may latch the digital signal provided by the ADC 60, wherein the latched signal may be sequentially output to (e.g.,) an image signal processor depending on the result of decoding performed by the column decoder 80.

Referring to FIG. 2, pixels 'P' are arranged in a row/column matrix to within the active pixel sensor array 10. Each pixel P may include a photoelectric conversion element 11, a floating diffusion region 13, a charge transfer element 15, a drive element 17, a reset element 18, and a selection element 19. The various functionality of the photoelectric conversion element 11, the floating diffusion region 13, the charge transfer element 15, the drive element 17, the reset element 18, and the selection element 19 of each of the pixels P will be described hereinafter assuming an exemplary arrangement of pixels including an ordinate pixel P(i, j) and additional pixels extending in the row direction (j+n), where 'n' is a natural number and in the column direction (i+m), where 'm' is a natural number from the ordinate pixel P(i, j).

The photoelectric conversion element 11 may receive incident light and accumulate electrical charge corresponding to the intensity of the incident light. Examples of the photoelectric conversion element 11 include a photodiode, a phototransistor, a photogate, a pinned photodiode, and a combination thereof. In the example of FIG. 2, the photoelectric conversion element 11 is assumed to be a photodiode.

The photoelectric conversion element 11 may be coupled to the charge transfer element 15 capable of transmitting the accumulated charge to the floating diffusion region 13. That is, the floating diffusion region 13, which has a parasitic capacitance, may be used to store the accumulated charge which may be manifest as an electrical potential.

The drive element 17 (e.g., a source-follower amplifier) may be used to amplify variations in the electrical potential of the floating diffusion region 13 and output a result of the amplification to an output line Vout.

The reset element 18 may be used to periodically reset the floating diffusion region 13. The reset element 18 may consist of a metal oxide semiconductor (MOS) transistor driven by a bias (e.g., a reset signal) provided by a reset line RX(i). In response to the reset element 18 being turned ON by the bias provided by the reset line RX(i), a predetermined electrical potential provided to the drain of the reset element 18 (e.g., a power supply voltage VDD) may be transmitted to the floating diffusion region 13.

The selection element 19 may select a row of pixels P to be read. The selection element 19 may consist of a MOS transistor driven by a bias (e.g., a row selection signal) provided by a row selection line SEL(i). In response to the selection element 19 being turned ON by the bias provided by the row selection line SEL(i), the predetermined electrical potential provided to the drain of the selection element 19 (e.g., the power supply voltage VDD) may be transmitted to the drain region of the drive element 17.

A transmission line TX(i) which may be used to apply a bias to the charge transfer element 15, the reset line RX(i) which may be used to apply a bias to the reset element 18, and the row selection line SEL(i) which may be used to apply a bias to the selection element 19, may be singularly or collectively arranged, and may extend substantially in parallel.

Referring to FIG. 3, the image sensor of FIGS. 1 and 2 may include a sensor array region I and a peripheral circuit region II, where the peripheral circuit region II is disposed at least partially surrounding the sensor array region I in a lateral (or horizontal) X/Y plane relative to a vertical direction Z. Here, those skilled in the art will recognize that definition of certain geometric terms such as: "vertical" and "lateral"; "inward" and "outward"; "above" and "below"; "up" and "down"; "around", "surround", "beside", and/or "proximate" are arbitrary and relative in their descriptive nature.

The sensor array region I may include (e.g.,) the active pixel sensor array 10 of FIG. 1, wherein the active pixel sensor array 10 in the sensor array region I may include a plurality of unit pixel regions.

The peripheral circuit region II may include (e.g.,) the timing generator 20, row decoder 30, row driver 40, CDS 50, ADC 60, latch 70 and/or column decoder 80 of FIG. 1. Here, the illustrated example of FIG. 3 shows the peripheral circuit region II fully surrounding the sensor array region I, but this need not always be the case. Alternatively, the peripheral circuit region II may overlap all, or a portion of the sensor array region I. For example, the peripheral circuit region II may be formed in a lower substrate, and the sensor array region I may be formed in an upper substrate vertically stacked on the lower substrate.

Referring to FIGS. 4 and 5, the image sensor of FIGS. 1, 2 and 3 may include a substrate 100, photoelectric conversion elements PD, an insulating layer 105, an insulating structure 110, gate structures 115, a first isolation layer 120, a second isolation layer 130, a trench passivation layer 135, a passivation layer 140, a planarization layer 150, an anti-reflection layer 160, fence structures 170, a liner layer 175, color filters 180, and micro-lenses 190.

The substrate 100 may include opposing first and second surfaces 100a and 100b. For example, a P-type or N-type bulk substrate, a substrate obtained by growing a P-type or N-type epitaxial layer on a P-type bulk substrate, or a substrate obtained by growing a P-type or N-type epitaxial layer on an N-type bulk substrate may be used as the substrate 100. In another example, a substrate other than a semiconductor substrate, such as an organic plastic substrate, may be used as the substrate 100.

The photoelectric conversion elements PD may be disposed in the substrate 100. The photoelectric conversion elements PD may be, for example, photodiodes, but the present disclosure is not limited thereto. A plurality of photoelectric conversion elements PD may be disposed in the substrate 100. The photoelectric conversion elements PD may be separated by the first and second isolation layers 120 and 130.

A plurality of gate structures 115 may be disposed on the first surface 100a of the substrate 100. Here, the gate structures 115 may be laterally spaced apart in the X direction (e.g., a first lateral direction). The gate structures 115 may extend in the Y direction (e.g., a second lateral direction). The gate structures 115 may be, for example, the gates of charge transfer elements, the gates of reset elements, or the gates of drive elements.

FIG. 4 shows a plurality of gate structures 115 are disposed on the first surface 100a of the substrate 100, but the present disclosure is not limited thereto. Alternatively, the gate structures 115 may be recessed into the substrate 100 or buried in the substrate 100.

The insulating structure 110 may be disposed on the first surface 100a of the substrate 100. The insulating structure 110 may include metal wires 112 and an interlayer insulating layer 114, which is disposed to surround the metal wires 112.

The metal wires 112 may include, for example, aluminum (Al), copper (Cu), tungsten (W), cobalt (Co), or ruthenium (Ru), but the present disclosure is not limited thereto.

The metal wires 112 may include a plurality of wires that are sequentially stacked. FIG. 4 illustrates that the metal wires 112 include two layers of metal wires that are sequentially stacked, but the present disclosure is not limited thereto.

The interlayer insulating layer 114 may include at least one of (e.g.,) silicon oxide ($SiO_2$), silicon nitride (SiN), silicon oxynitride (SiON), a low-k material, and a combination thereof.

The insulating layer 105 may be disposed between the first surface 100a of the substrate 100 and the insulating structure 110. The insulating layer 105 may be disposed to cover the gate structures 115, which are disposed on the first surface 100a of the substrate 100.

The insulating layer 105 may include at least one of, for example, silicon oxide ($SiO_2$), silicon nitride (SiN), silicon oxynitride (SiON), a low-k material, and a combination thereof.

First trenches T1 may downwardly extend in a Z (or third) direction (i.e., a vertical direction) from the first surface 100a into the substrate 100 between the photoelectric conversion elements PD.

The first isolation layer 120 may be disposed in the first trenches T1, such that a bottom surface of the first isolation layer 120 contacts the insulating layer 105.

The first isolation layer 120 may include at least one of, for example, silicon oxide ($SiO_2$), silicon nitride (SiN), silicon carbide (SiC), silicon oxy-carbide (SiOC), silicon oxynitride (SiON), and silicon oxy-carbonitride (SiOCN).

Second trenches T2 may be formed above the first trenches T1 between the photoelectric conversion elements PD. The second trenches T2 may downwardly extend in the vertical direction from the first surface 100a of the substrate 100 into the substrate 100. The second trenches T2 may extend to the second surface 100b of the substrate 100, but the present disclosure is not limited thereto.

A "lateral width" (i.e., a width measured in the first direction X) of the second trenches T2 may be smaller than a lateral width of the first trenches T1.

The second isolation layer 130 may be disposed in the second trenches T2. The second isolation layer 130 may include a different material from the first isolation layer 120. The second isolation layer 130 may include a material with excellent gap-fill performance such as (e.g.,) polysilicon (Poly-Si), but the present disclosure is not limited thereto.

The trench passivation layer 135 may be disposed in the second trenches T2 along the sidewall and the top surface of each of the second trenches T2. Specifically, in each of the second trenches T2, the trench passivation layer 135 may be disposed between the sidewall of the second isolation layer 130 between the second isolation layer 130 and the first isolation layer 120, and between the second isolation layer 130 and the passivation layer 140. The trench passivation layer 135 may surround the top surface and the sidewall of the second isolation layer 130.

FIG. 4 shows the trench passivation layer 135 being conformally formed in the second trenches T2, but the present disclosure is not limited thereto.

The trench passivation layer 135 may include the same material as the passivation layer 140 (e.g.,) a high-k insulating material, but the present disclosure is not limited thereto. Alternatively, the trench passivation layer 135 may include a different material from the passivation layer 140.

The passivation layer 140 may be disposed on the second surface 100b of the substrate 100, and may include (e.g.,) a high-k insulating material, such as (e.g.,) a material having an amorphous crystalline structure. Specifically, at least some of the high-k insulating material of the passivation layer 140 may have an amorphous crystalline structure, but the present disclosure is not limited thereto.

The planarization layer 150 may be disposed on the passivation layer 140. The planarization layer 150 may include at least one of (e.g.) a silicon oxide film-based material, a silicon nitride film-based material, a resin, and a combination thereof.

FIG. 4 shows the planarization layer 150 being formed as a single-layer film, but the present disclosure is not limited thereto. Alternatively, the planarization layer 150 may be formed as a multilayer film.

The anti-reflection layer 160 may be disposed on the planarization layer 150. The anti-reflection layer 160 may be disposed between the planarization layer 150 and the color filters 180 and/or between the planarization layer 150 and the fence structures 170.

The anti-reflection layer 160 may include a high-k material such as (e.g.) hafnium oxide ($HfO_2$), but the present disclosure is not limited thereto.

FIG. 4 shows the anti-reflection layer 160 being formed as a single-layer film, but the present disclosure is not limited thereto. Alternatively, the anti-reflection layer 160 may be formed as a multilayer film, and in some embodiments, the anti-reflection layer 160 may be omitted.

The fence structures 170 may be disposed on the second surface 100b of the substrate 100, such as (e.g.,) on the anti-reflection layer 160. The fence structures 170 may be disposed to extend (or protrude) in the third vertical direction Z from the anti-reflection layer 160. The fence structures 170 may be disposed to at least partially surround the sidewall of each color filter 180.

The top surfaces of the fence structures 170 may be formed lower than top surfaces 180a of the color filters 180. That is, the top surfaces of the fence structures 170 may be formed to be closer than the top surfaces 180a of the color filters 180 to the anti-reflection layer 160.

The liner layer 175 may be disposed on the top surfaces of the fence structures 170, between the fence structures 170 and the color filters 180, and between the anti-reflection layer 160 and the color filters 180. For example, the liner layer 175 may be conformally formed, but the present disclosure is not limited thereto.

The uppermost surface of the liner layer 175 may be on the same plane as the top surfaces 180a of the color filters 180, but the present disclosure is not limited thereto.

Each of the fence structures 170 may include a barrier layer 171, a low refractive index layer 172, a penetration prevention layer 173, and a mask layer 174, which are sequentially stacked on the anti-reflection layer 160.

The barrier layer 171 may include a first barrier layer 171_1, which is disposed on the anti-reflection layer 160, and a second barrier layer 171_2, which is disposed on the first barrier layer 171_1.

The barrier layer 171 may include a metal. That is, each of the first and second barrier layers 171_1 and 171_2 may include a metal, where the first barrier layer 171_1 may include (e.g.,) titanium (Ti) and the second barrier layer 171_2 may include (e.g.,) titanium nitride (TiN), but the present disclosure is not limited thereto.

A first lateral width of a bottom surface 171_1a of the first barrier layer 171_1 may be greater than a second lateral width a top surface 171_1b of the first barrier layer 171_1. As a result, the sidewall 171_1c of the first barrier layer 171_1 may have an inclined (or angular) profile overlaying the top surface of the anti-reflection layer 160. In this context, those skilled in the art will understand that the term "angular" is not intended to convey only a precise geometric shape, but rather a general profile formed when one surface of a barrier layer has a lateral width greater than another surface of the barrier layer.

A third lateral width of a bottom surface 171_2a of the second barrier layer 171_2 may be the same as the lateral width of a top surface 171_2b of the second barrier layer 171_2. That is, the sidewall 171_2c of the second barrier layer 171_2 may have a vertical profile (i.e., a profile extending substantially in the third direction Z).

Accordingly, the sidewall 171_1c of the first barrier layer 171_1 may form (or provide) an "angular lateral recess" in a lower portion of each fence structures 170. That is, the sidewall 171_1c of the first barrier layer 171_1 may be laterally recessed with an angular profile with respect to the vertical sidewall 171_2c of the second barrier layer 171_2. Hence, the bottom surface 171_2a of the second barrier layer 171_2 may be at least partially in contact with the liner layer 175 in the region associated with the angular lateral recess of the first barrier layer 171_1.

The low refractive index layer 172 may be disposed on the barrier layer 171. That is, the low refractive index layer 172 may be disposed on the second barrier layer 171_2.

The sidewall of the low refractive index layer 172 may have the same vertical profile as the sidewall 171_2c of the second barrier layer 171_2. That is, a lateral width of the low refractive index layer 172 may be the same as the lateral width of the second barrier layer 171_2.

The low refractive index layer 172 may include at least one of (e.g.,) an oxide, a nitride, and an oxynitride, but the present disclosure is not limited thereto.

The penetration prevention layer 173 may be disposed on the low refractive index layer 172. The sidewall of the penetration prevention layer 173 may have the same vertical profile as the sidewall of the low refractive index layer 172. That is, a lateral width of the penetration prevention layer 173 may be the same as the lateral width of the low refractive index layer 172.

The penetration prevention layer 173 may include (e.g.,) silicon oxide ($SiO_2$), but the present disclosure is not limited thereto. Alternatively, the penetration prevention layer 173 may include aluminum oxide ($Al_2O_3$).

A thickness 't' in the third direction Z of the penetration prevention layer 173 may be in a range extending from about 50 nm to about 150 nm (e.g., t may be about 100 nm).

The top surface 173a of the penetration prevention layer 173 may be formed to be lower than (i.e., at a lower vertical plane with respect to the substrate) the top surfaces 180a of the color filters 180. That is, the top surface 173a of the penetration prevention layer 173 may be formed at a vertical plane that is closer to the top surfaces 180a of the color filters 180 to the anti-reflection layer 160.

The penetration prevention layer 173 may prevent various material(s) (e.g., a mask material layer 174L of FIG. 11) used during the formation of the fence structures 170 from penetrating into the low refractive index layer 172.

The mask layer 174 may be disposed on the penetration prevention layer 173. The sidewall of the mask layer 174 may have the same vertical profile as the sidewall of the penetration prevention layer 173. That is, a lateral width of the mask layer 174 may be the same as the lateral width of the penetration prevention layer 173.

The mask layer 174 may include (e.g.) at least one of amorphous carbon, silicon nitride (SiN), silicon carbide (SiC), silicon oxynitride (SiON), silicon carbonitride (SiCN), and silicon oxycarbonitride (SiOCN), but the present disclosure is not limited thereto.

The top surface of the mask layer 174 may be formed to be lower than the top surfaces 180a of the color filters 180. That is, the top surface of the mask layer 174 may be formed to be closer than the top surfaces 180a of the color filters 180 to the anti-reflection layer 160.

FIGS. 4 and 5 collectively show that each of the fence structures 170 may include the mask layer 174 disposed on the penetration prevention layer 173, but the present disclosure is not limited thereto. Alternatively, the mask layer 174 may be omitted and each fence structure 170 may include the barrier layer 171, the low refractive index layer 172, and the penetration prevention layer 173.

The color filters 180 may be disposed between the fence structures 170, on the anti-reflection layer 160. Specifically, the color filters 180 may be disposed on the liner layer 175, which is disposed on the top surface of the anti-reflection layer 160 and on the sidewall of the fence structures 170.

The color filters 180 may include (e.g.,) red filters, green filters, and/or blue filters.

The micro-lenses 190 may be disposed between the fence structures 170 and the color filters 180. The liner layer 175 may be disposed between the micro-lenses 190 and the fence structures 170. The micro-lenses 190 may be formed of an organic material such as a photosensitive resin, or an inorganic material.

Certain image sensors according embodiments of the present disclosure may include the penetration prevention layer 173 disposed between the low refractive index layer 172 and the mask layer 174 in order to prevent material(s) (e.g., the mask material layer 174L of FIG. 11) used to form the fence structures 170 from penetrating into the low refractive index layer 172.

A method of fabricating an image sensor according to embodiments of the present disclosure will now be described in some additional detail with reference to FIGS. 4 through 13, inclusive. Here, FIGS. 6 through 13 are respective, related cross-sectional views illustrating a method of fabricating an image sensor according to embodiments of the present disclosure.

Figure 6:
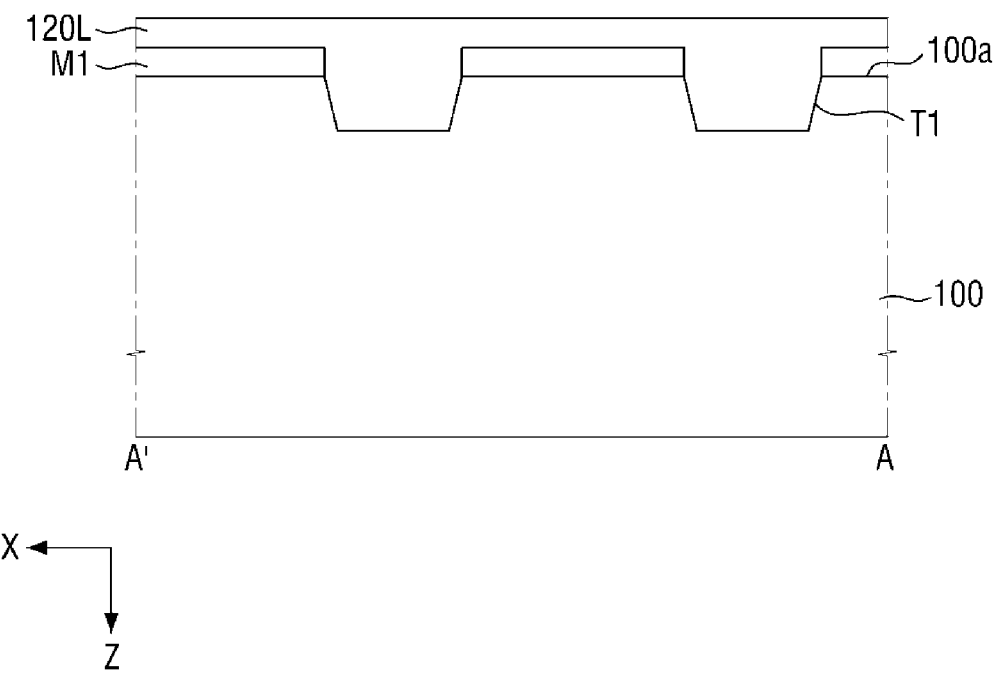
FIGS. 6, 7, 8, 9, 10, 11, 12 and 13 are respective, related cross-sectional views illustrating a method of fabricating an image sensor according to embodiments of the present disclosure.

Referring to FIG. 6, first mask patterns M1 may be formed on a first surface 100a of a substrate 100.

Thereafter, first trenches T1 may be formed in the substrate 100 by etching the first surface 100a of the substrate 100 using the first mask patterns M1 as a mask. FIG. 6 shows that the sidewall of each of the first trenches T1 may have, at least in part, an inclined profile, but the present disclosure is not limited thereto.

Thereafter, a first filling layer 120L may be formed on the first mask patterns M1 and in the first trenches T1. The first filling layer 120L may include at least one of (e.g.,) silicon oxide ($SiO_2$), silicon nitride (SiN), silicon carbide (SiC), silicon oxycarbide (SiOC), silicon oxynitride (SiON), and silicon oxycarbonitride (SiOCN).

Figure 7:
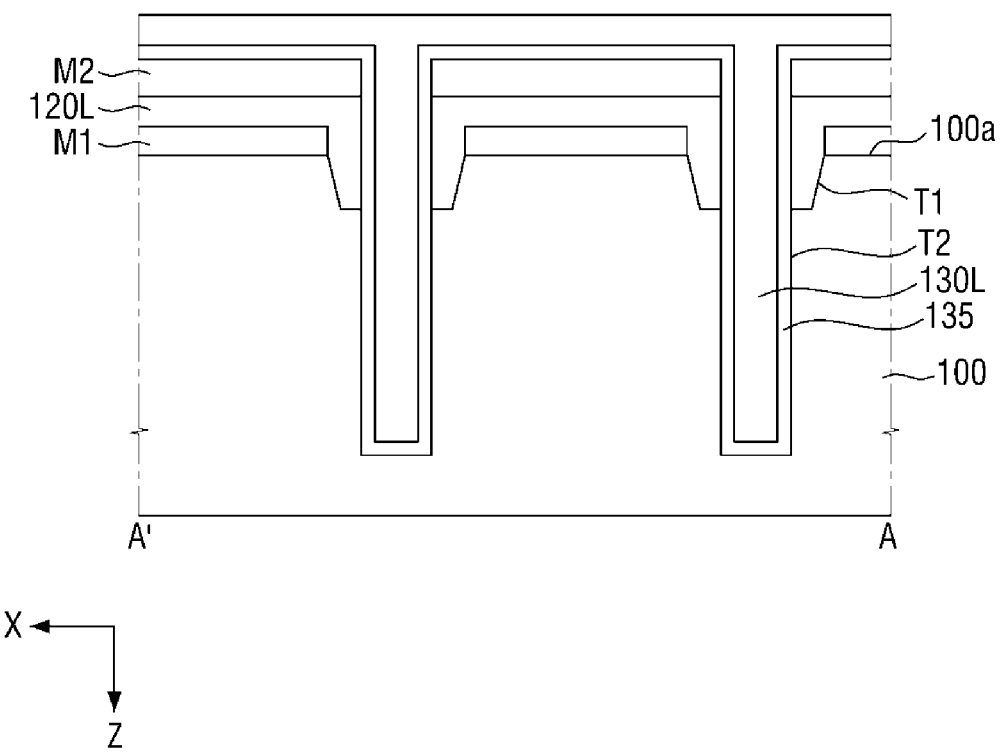

Referring to FIG. 7, second mask patterns M2 may be formed on the first filling layer 120L, and second trenches T2 may be formed in the substrate 100 by etching the first filling layer 120L and the substrate 100 through the second mask patterns M2.

The second trenches T2 may be formed to vertically extend into the substrate 100 below the first trenches T1 through portions of the first filling layer 120L in the first trenches T1. A lateral width of the second trenches T2 may be smaller than a lateral width of the first trenches T1.

Thereafter, a trench passivation layer 135 including a high-k insulating material may be formed on the second mask patterns M2 and on the sidewalls and the bottom surface of each of the second trenches T2.

Alternatively, after the removal of the second mask patterns M2, the trench passivation layer 135 may be formed on the sidewalls and the bottom surface of each of the second trenches T2.

FIG. 7 shows the trench passivation layer 135 being conformally formed on the second mask patterns M2 and on the sidewalls and the bottom surface of each of the second trenches T2, but the present disclosure is not limited thereto.

Thereafter, a second filling layer 130L may be formed on the trench passivation layer 135 to fill the second trenches T2. The second filling layer 130L may also be formed on portions of the trench passivation layer 135 on the second mask patterns M2.

Figure 8:
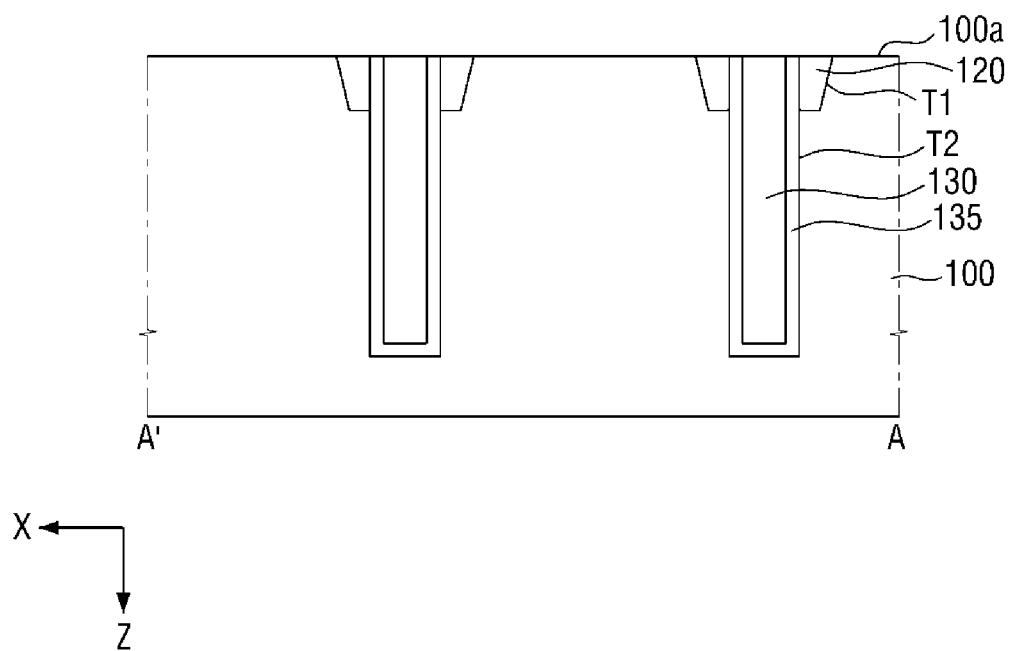

Referring to FIG. 8, the second filling layer 130L, the trench passivation layer 135, the second mask patterns M2, the first filling layer 120L, and the first mask patterns M1 may be removed from the first surface 100a of the substrate 100 by performing a planarization etching process (e.g., a chemical mechanical polishing (CMP) process).

As a result of the planarization etching process, a first isolation layer 120, a second isolation layer 130, and the trench passivation layer 135 may be exposed on the same plane as the first surface 100a of the substrate 100 as shown in FIG. 8.

In this manner, the first isolation layer 120 may be formed in the first trenches T1, and the second isolation layer 130 may be formed in the second trenches T2.

Figure 9:
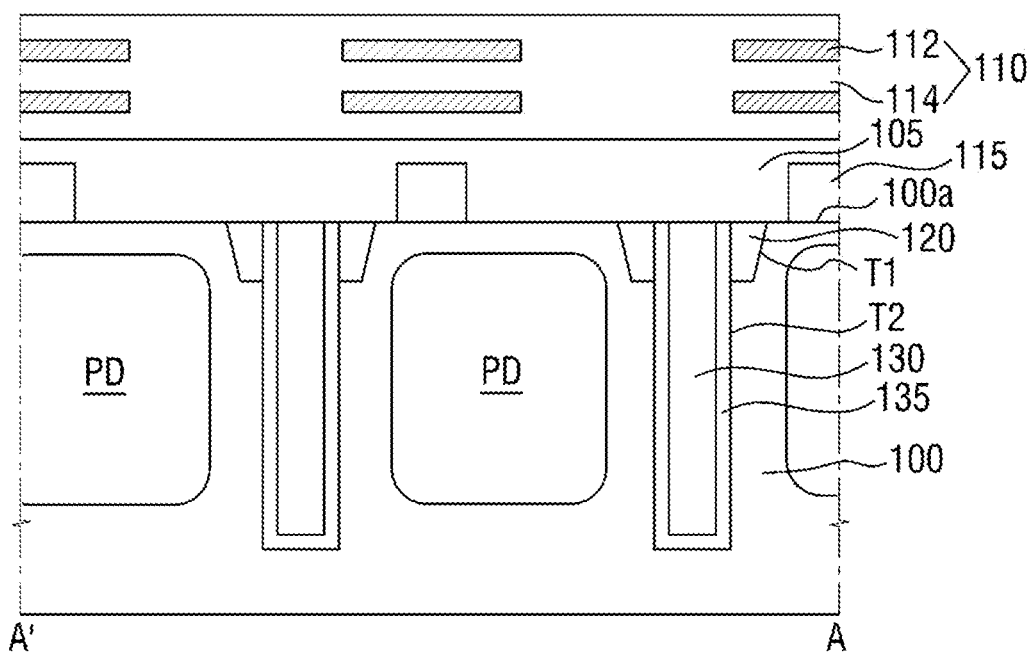

Referring to FIG. 9, a plurality of photoelectric conversion elements PD may be formed in the substrate 100 on opposing sides of each of the second trenches T2. The photoelectric conversion elements PD may be formed using one or more ion implantation process(es).

Thereafter, a plurality of gate structures 115 may be formed on the first surface 100a of the substrate 100, where the gate structures 115 do not overlap the first isolation layer 120 (i.e., the first isolation layer 120 is disposed between the gate structures 115).

Thereafter, an insulating layer 105 may be formed to cover the first surface 100a of the substrate 100, the gate structures 115, the exposed first isolation layer 120, the exposed second isolation layer 130, and the exposed trench passivation layer 135.

Thereafter, an insulating structure 110 including metal wires 112 and an interlayer insulating layer 114 may be formed on the insulating layer 105.

Figure 10:
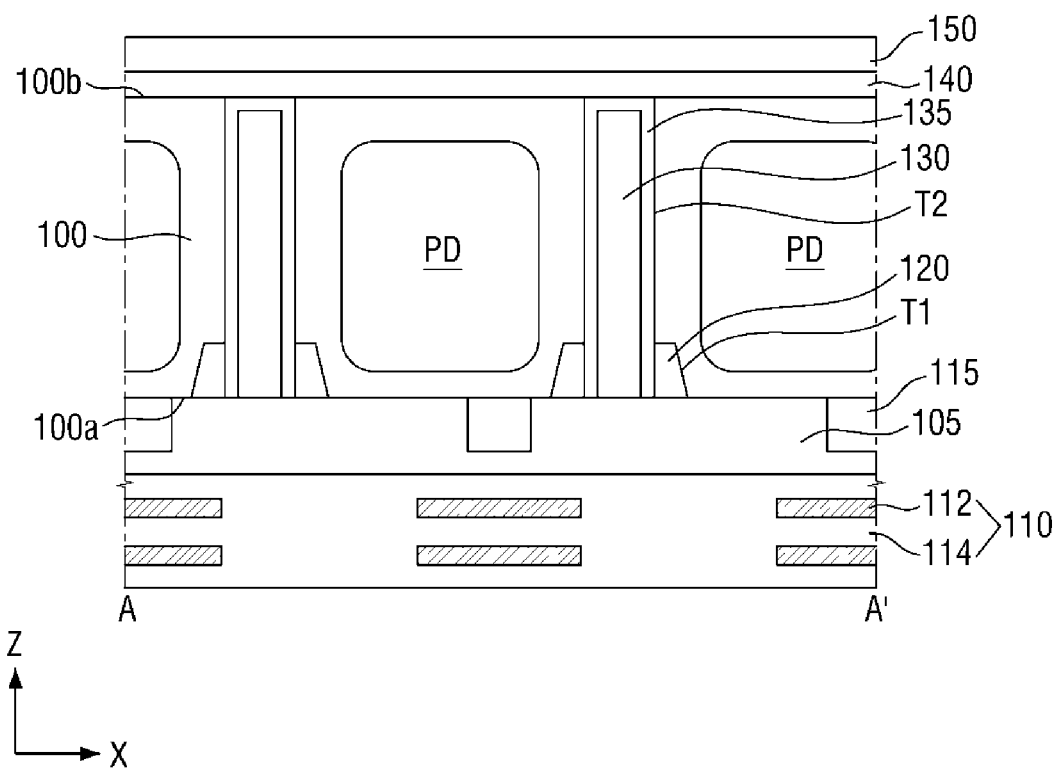

Referring to FIG. 10, part of the substrate 100 may be removed to reduce the thickness of the substrate 100. In this case, the substrate 100 may be turned upside down so that the second surface 100b of the substrate 100 faces upward, and then, a portion of the substrate 100 may be removed by performing a planarization etching process (e.g., a CMP process). As a result of the planarization etching process, the trench passivation layer 135 in the second trenches T2 may be exposed on the same plane as the second surface 100b of the substrate 100.

Thereafter, a passivation layer 140 may be formed on the second surface 100b of the substrate 100. The passivation layer 140 may be formed using at least one of (e.g.,) atomic layer deposition (ALD), physical vapor deposition (PVD), and chemical vapor deposition (CVD). Thereafter, a planarization layer 150 may be formed on the passivation layer 140.

Figure 11:
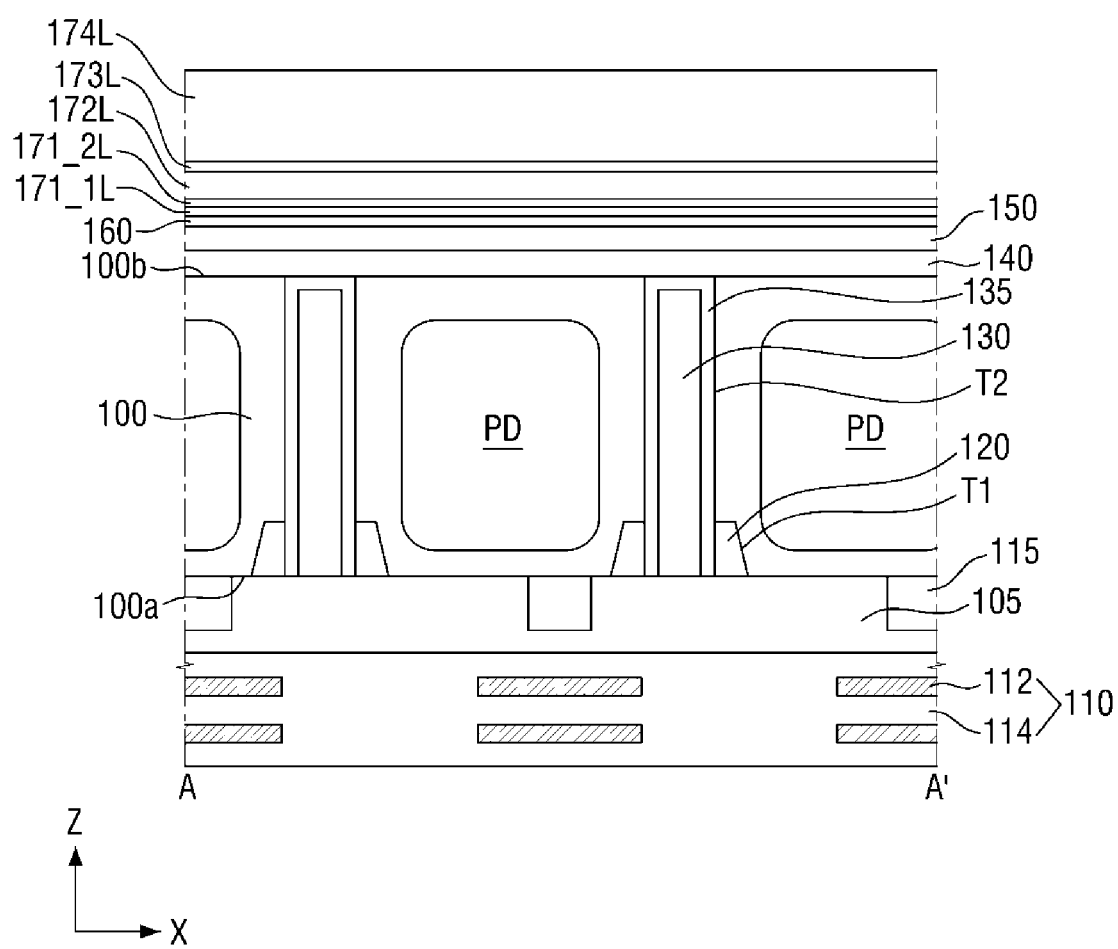

Referring to FIG. 11, an anti-reflection layer 160, a first barrier material layer 171_1L, a second barrier material layer 171_2L, a low refractive index material layer 172L, a penetration prevention material layer 173L, and a mask material layer 174L may be sequentially formed on the planarization layer 150.

Due to the penetration prevention material layer 173L, the material of the mask material layer 174L will not penetrate into the low refractive index material layer 172L during the formation of the mask material layer 174L.

Figure 12:
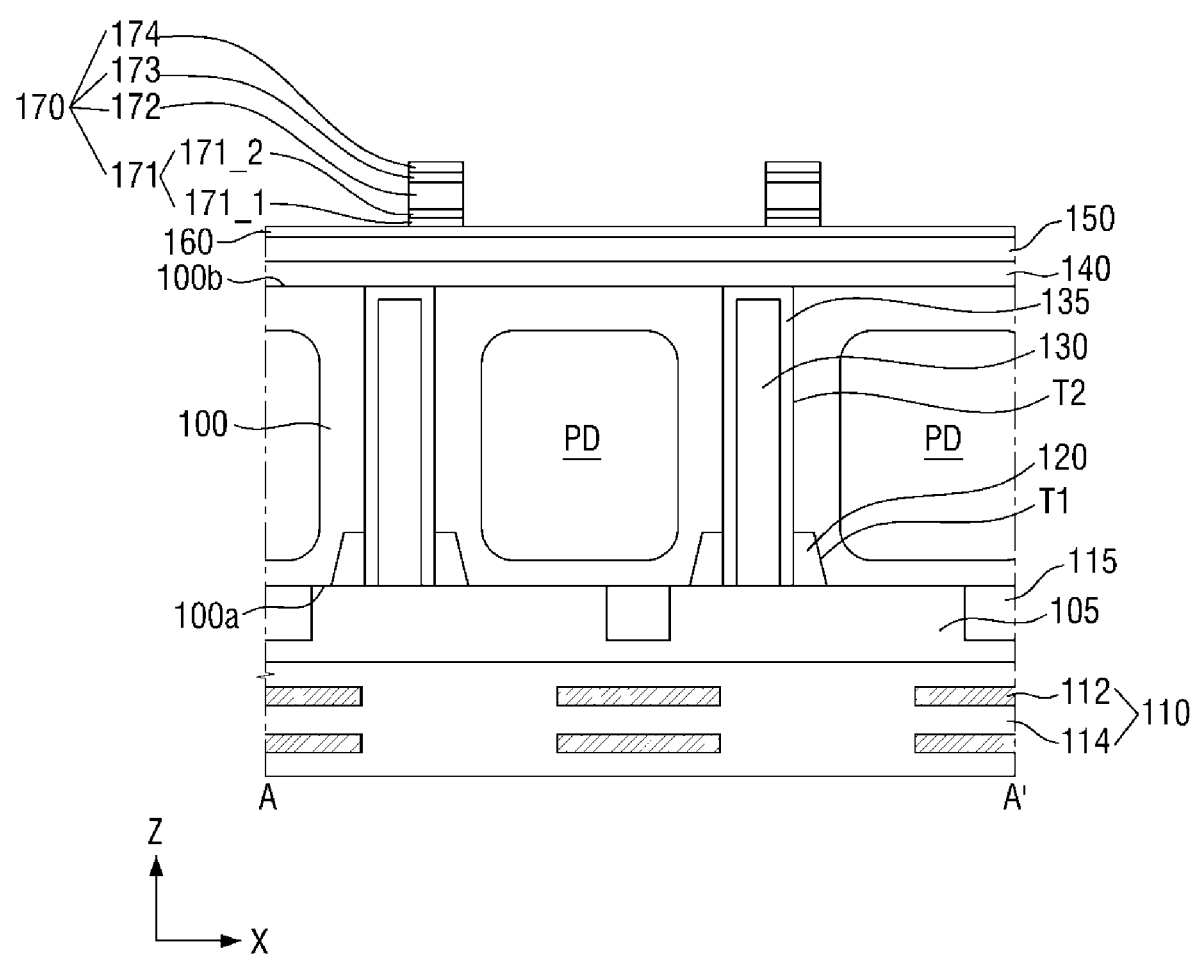

Referring to FIG. 12, the first barrier material layer 171_1L, the second barrier material layer 171_2L, the low refractive index material layer 172L, the penetration prevention material layer 173L, and the mask material layer 174L may be patterned using mask patterns as a mask. In this case, an upper part of the mask material layer 174L may be selectively removed (or patterned).

As a result of the patterning of the first barrier material layer 171_1L, the second barrier material layer 171_2L, the low refractive index material layer 172L, the penetration prevention material layer 173L, and the mask material layer 174L, fence structures 170 may be formed on the anti-reflection layer 160.

Figure 13:
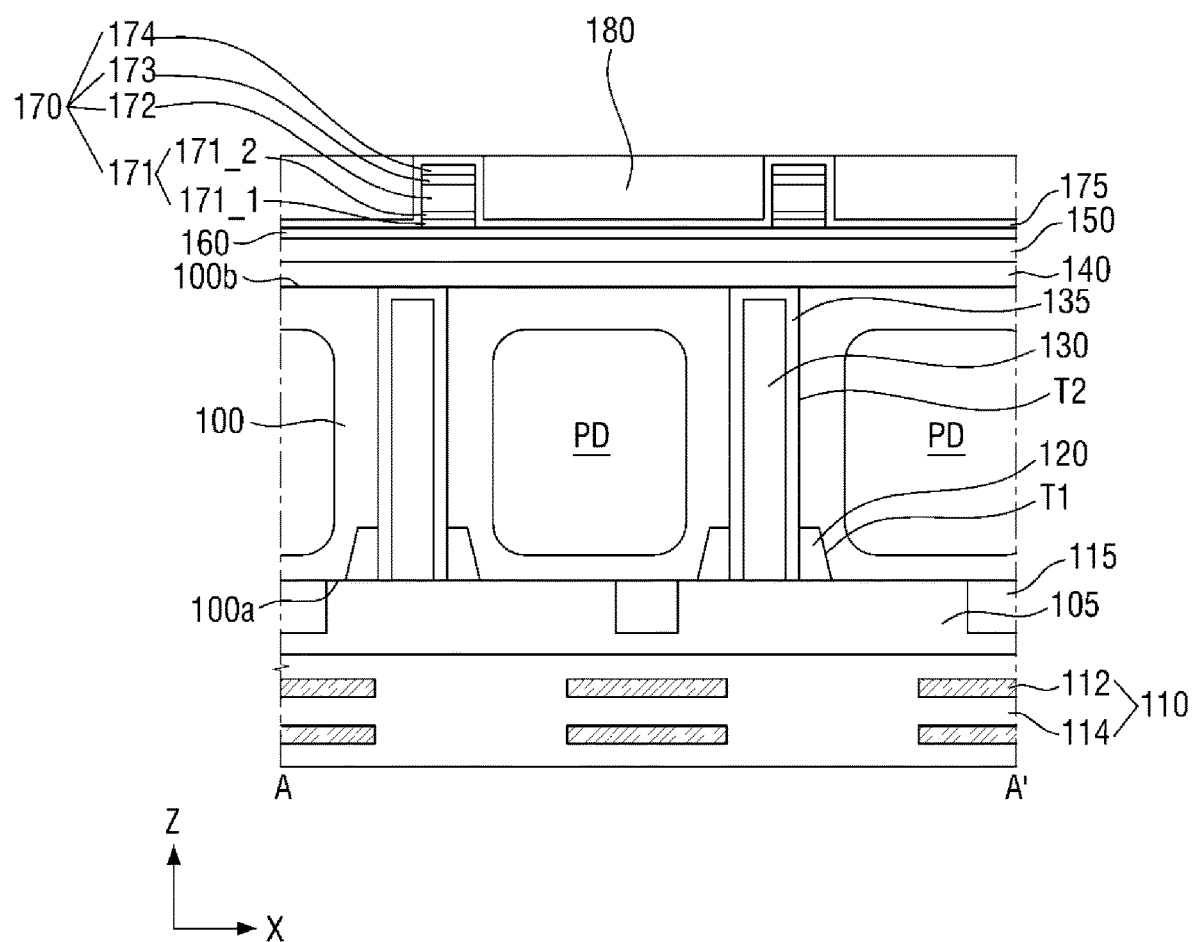

Referring to FIG. 13, a liner layer 175 may be formed to cover the top surface of the anti-reflection layer 160 and the top surface and the sidewall of the fence structures 170. In the illustrated example of FIG. 13, the liner layer 175 is conformally formed.

Thereafter, color filters 180 may be formed on the liner layer 175, between the fence structures 170. In this case, top surfaces 180a of the color filters 180 may be formed on the same plane as the uppermost surface of the liner layer 175, but the present disclosure is not limited thereto. Alternatively, the top surfaces 180a of the color filters 180 may be formed to be lower than the uppermost surface of the liner layer 175.

Thereafter, micro-lenses 190 may be formed on the color filters 180 and on the liner layer 175, thereby obtaining the image sensor of FIG. 4.

Various image sensors according to embodiments of the present disclosure will now be further described with reference to FIGS. 14, 15, 16, 17, 18, 19, 20 and 21 (hereafter, "FIGS. 14 through 21"). Details already described in relation to FIGS. 4 and 5 and common to the respective embodiments of FIGS. 14 through 21 will not be fully reiterated.

Figure 14:
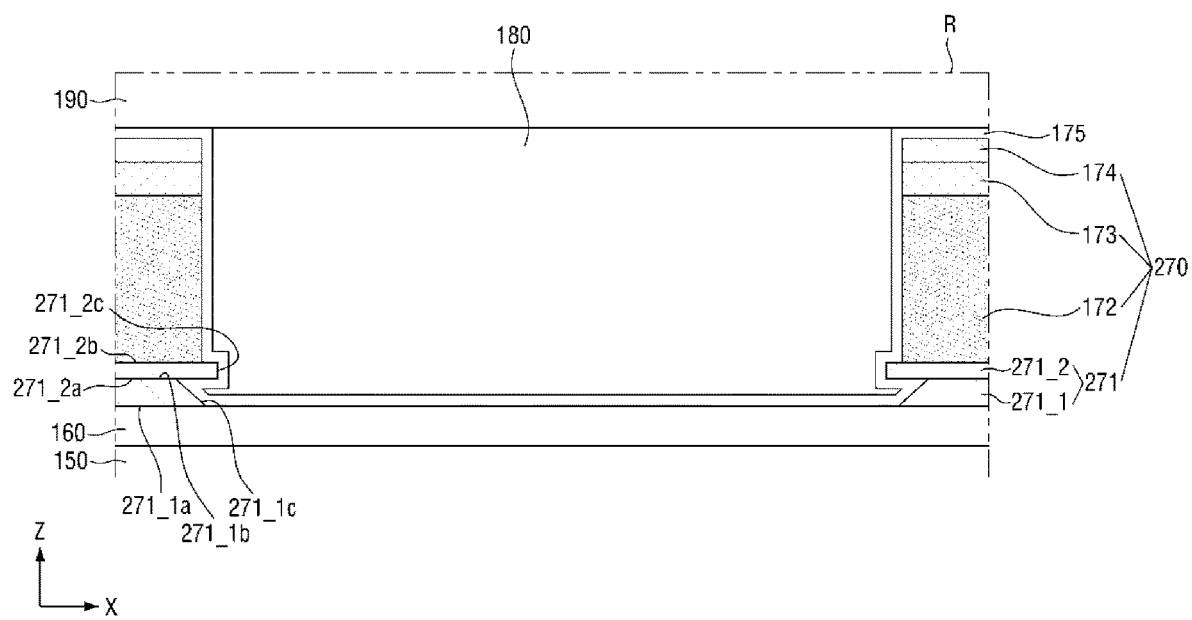
FIGS. 14, 15, 16, 17, 18, 19, 20 and 21 are respective cross-sectional views of image sensors according to embodiments of the present disclosure.

FIG. 14 is a cross-sectional view of an image sensor according to embodiments of the present disclosure.

In relation to the illustrated example of FIG. 14, a descriptive geometric convention will be assumed for clarity of explanation. According to this geometric convention the general position of the color filter 180 is used as a lateral (first direction X) reference point. Some relative variances in material(s) (e.g., "a protrusion") may be referred to as an "inward lateral protrusion" when the protrusion extends in the first direction X towards the color filter 180, and other relative variances in material(s) (e.g., "a recess") may be referred to as an "outward lateral recess" when the recess extends in the first direction X away from the color filter 180.

Thus, with reference to FIG. 14, at least a portion of a barrier layer 271 may form an inward lateral protrusion relative to the sidewall (e.g., the sidewall closest to the color filter 180) of the fence structures 270. Specifically, upper sidewall portions 271_2c of a second barrier layer 271_2 may inwardly protrude in the first direction X relative to the substantially vertical sidewall of the fence structures 270 to form the inward lateral protrusion.

Hence, a first lateral width of a bottom surface 271_1a of a first barrier layer 271_1 may be greater than a second lateral width of a top surface 271_1b of the first barrier layer 271_1. The resulting sidewall 271_1c of the first barrier layer 271_1 having an angular profile is formed on the top surface of the anti-reflection layer 160. Thus, relative to the overlaying second barrier layer 271_2 and the underlying anti-reflection layer 160, the first barrier layer 271_1 forms an angular lateral recess.

A third lateral width of a bottom surface 271_2a of the second barrier layer 271_2 may be the same as the lateral width of a top surface 271_2b of the second barrier layer 271_2, and the sidewall 271_2c of the second barrier layer 271_2 may be substantially vertical. Here, it should be noted that in certain embodiments the third lateral width may be greater than the second lateral width and the first lateral width.

The sidewall 271_1c of the first barrier layer 271_1 may be formed to provide an inward lateral protrusion relative to the substantially vertical sidewall of the fence structures 270, and the sidewall 271_1c of the first barrier layer 271_1 may be formed to provide an outward lateral recess below and relative to the sidewall 271_2c of the second barrier layer 271_2. With this configuration, at least a portion of the top surface 271_2b, at least a portion of the sidewall portion of the bottom surface 271_2a of the second barrier layer 271_2 may contact the liner layer 175.

Figure 15:
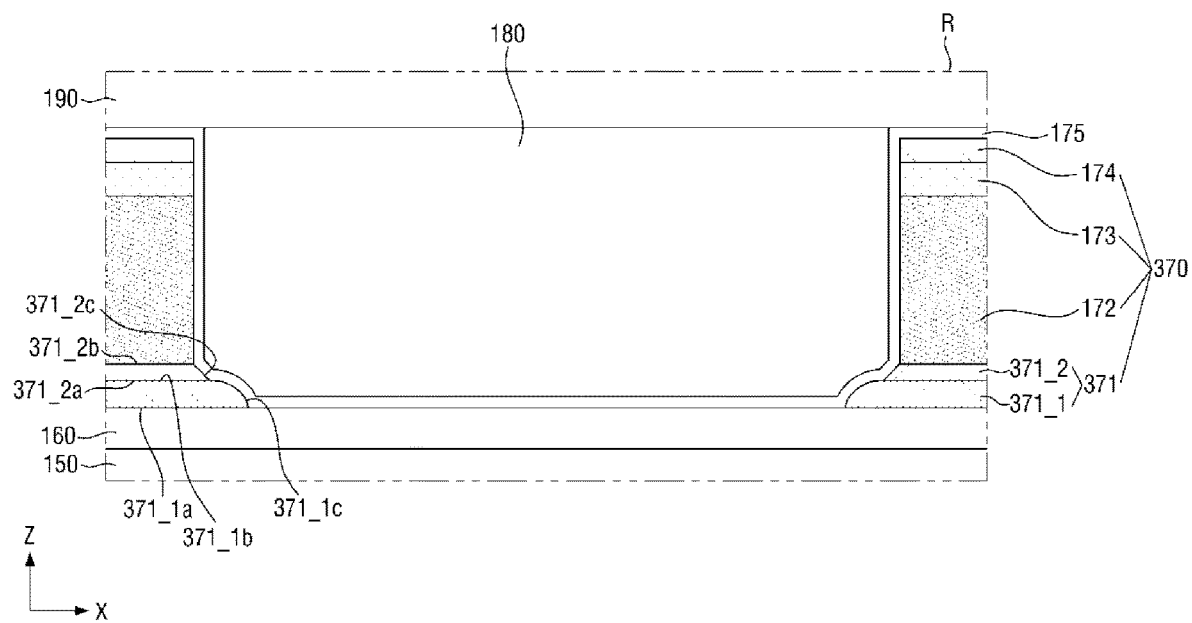

FIG. 15 is a cross-sectional view of an image sensor according to embodiments of the present disclosure.

Referring to FIG. 15, portions of a barrier layer 371 may inwardly protrude with respect to the sidewall of the fence structures 370. Specifically, sidewall 371_2c of a second barrier layer 371_2 may protrude inwardly from the sidewall of the fence structures 370 to form a second lateral protrusion. Sidewall 371_1c of a first barrier layer 371_1 may further protrude inwardly from the fence structures 370 to form a first lateral protrusion. Here, the first lateral protrusion formed from the first barrier layer 371_1 is greater in width than the second lateral protrusion formed from the second barrier layer 371_2 overlaying the first barrier layer 371_1.

Hence a first lateral width of a bottom surface 371_1a of the first barrier layer 371_1 may be greater than a second lateral width of a top surface 371_1b of the first barrier layer 371_1. In this case, sidewall 371_1c of the first barrier layer 371_1 will have an angular profile inwardly protruding towards the color filter 180 (i.e., a first lateral protrusion).

Likewise, a third lateral width of a bottom surface 371_2a of the second barrier layer 371_2 will be greater than a fourth lateral width of a top surface 371_2b of the second barrier layer 371_2. Accordingly, the sidewall 371_2c of the second barrier layer 371_2 will also have an angular shape inwardly protruding towards the color filter 180 (i.e., a second lateral protrusion). Thus, a first lateral protrusion formed by a portion of the first barrier layer 371_1 is formed on the top surface of an anti-reflection layer 160, and a second lateral protrusion formed by a portion of the second barrier layer 371_2 is formed on the first inward lateral protrusion. The combination of the first lateral protrusion and the second lateral protrusion may be understood as the barrier layer 371 including a "composite lateral protrusion."

Figure 16:
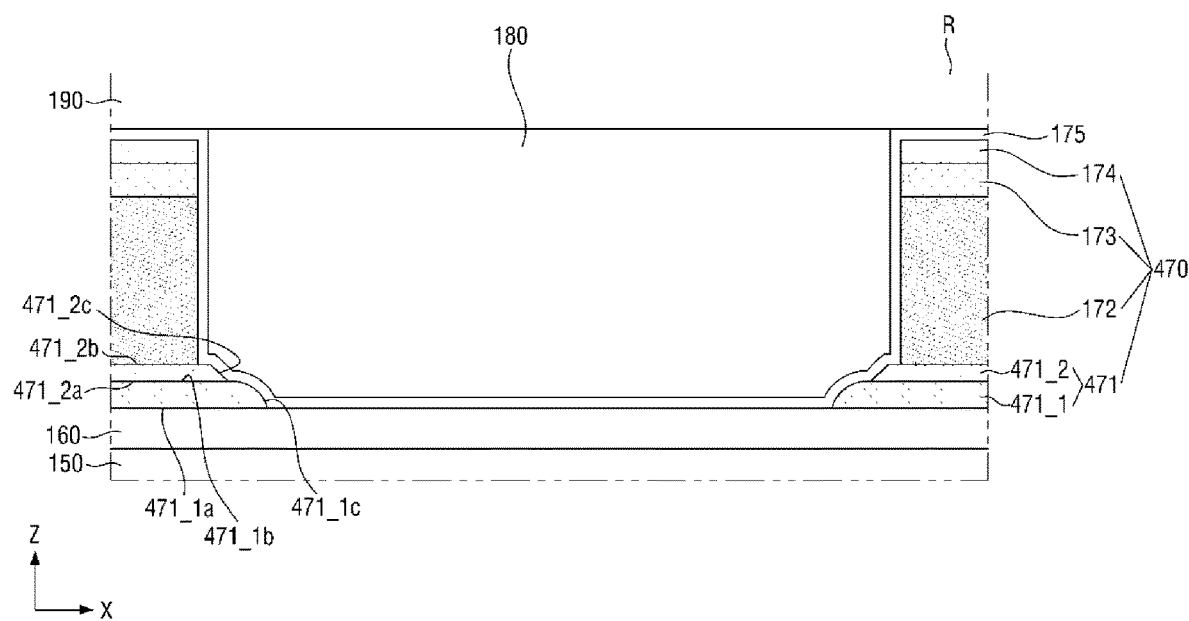

FIG. 16 is a cross-sectional view of an image sensor according to embodiments of the present disclosure.

Referring to FIG. 16, a barrier layer 471 also includes a composite lateral protrusion relative to the sidewall of fence structures 470. However, in contrast to the embodiment illustrated in FIG. 15, the embodiment of FIG. 16 provides at least a portion of an upper surface 471_2b of an second barrier layer 471_2—in addition to the sidewall 471_2c of the second barrier layer 471_2 come in contact with the liner layer 175. Accordingly, the sidewall 471_2c of a second barrier layer 471_2 may protrude inward towards the color filter 180 from the substantially vertical sidewall of the fence structures 470.

Thus, a first inward lateral protrusion formed by a portion of a first barrier layer 471_1 is formed on the top surface of an anti-reflection layer 160, a second inward lateral protrusion formed by a lower portion of the second barrier layer 471_2 is formed on the first inward lateral protrusion, and a third inward lateral protrusion formed by an upper portion of the second barrier layer 471_2 is formed on the second inward lateral protrusion, where the combination of the first inward lateral protrusion, the second inward lateral protrusion and the third inward later protrusion form a composite lateral protrusion.

Figure 17:
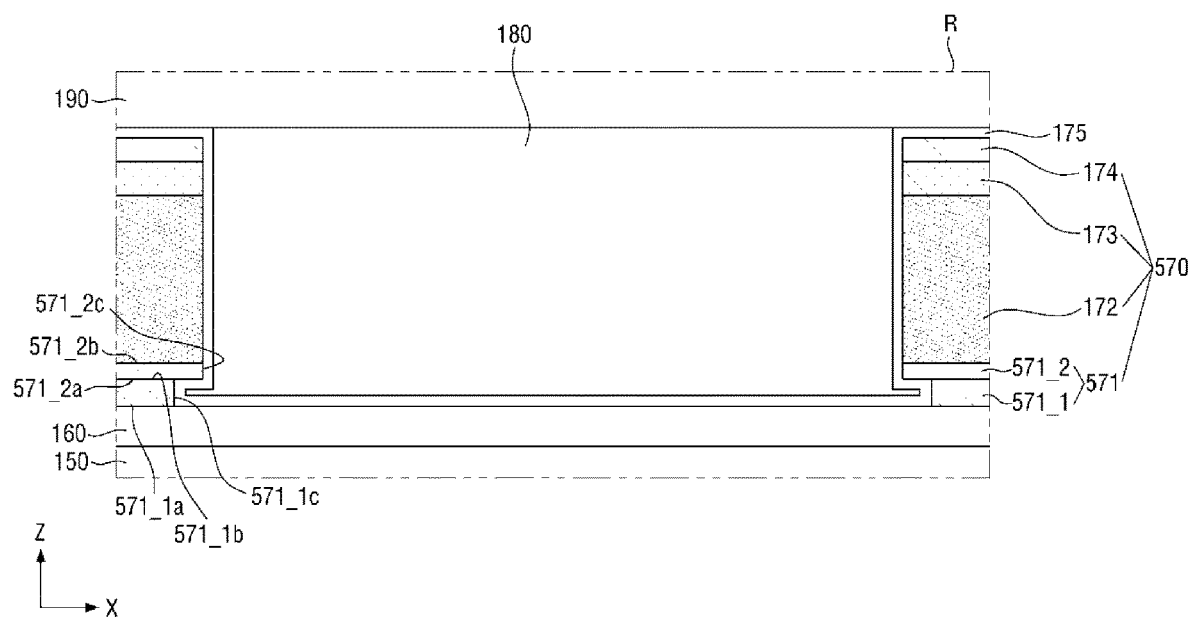

FIG. 17 is a cross-sectional view of an image sensor according to embodiments of the present disclosure.

Referring to FIG. 17, a barrier layer 571 may include (or be formed to provide) an outward lateral recess relative to the sidewall of fence structures 570. Specifically, sidewall 571_1c of a first barrier layer 571_1 may be outwardly recessed away from the color filter 180 to underlay at least a portion of the substantially vertical sidewall of the fence structures 570.

Hence, a first lateral width of a bottom surface 571_1a of the first barrier layer 571_1 may be the same as a second lateral the later width of a top surface 571_1b of the first barrier layer 571_1, such that the sidewall 571_1c of the first barrier layer 571_1 have a substantially vertical profile. A second lateral width of a bottom surface 571_2a of a second barrier layer 571_2 may be the same as the lateral width of a top surface 571_2b of the second barrier layer 571_2, such that the sidewall 571_2c of the second barrier layer 571_2 have a substantially vertical profile. Here, at least a portion of the bottom surface 571_2a of the second barrier layer 571_2 will contact the liner layer 175.

Figure 18:
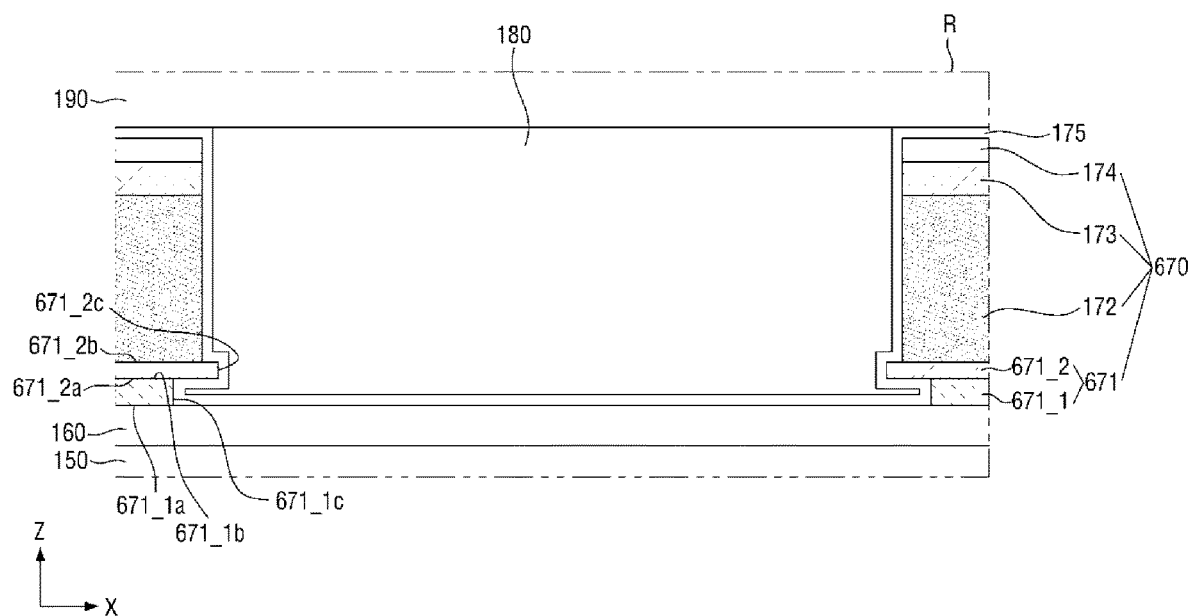

FIG. 18 is a cross-sectional view of an image sensor according to embodiments of the present disclosure.

Referring to FIG. 18, a barrier layer 671 may include (or be formed to provide) both (an overlaying) inward lateral protrusion and (an underlying) outward lateral recess, the combination of which may be understood as a "cantilever protrusion" relative to the sidewall of fence structures 670. Specifically, sidewall 671_2c of a second barrier layer 671_2 may protrude inwardly from the sidewall of the fence structures 670 (an inward lateral protrusion), and sidewall 671_1c of a first barrier layer 671_1 may be recessed from under the inward lateral protrusion with respect to the sidewall of the fence structures 670.

A first lateral width of a bottom surface 671_1a of the first barrier layer 671_1 may be the same as the lateral width of a top surface 671_1b of the first barrier layer 671_1, such that the sidewall 671_1c of the first barrier layer 671_1 have a substantially vertical profile.

A second lateral width of a bottom surface 671_2a of a second barrier layer 671_2 may be the same as the lateral width of a top surface 671_2b of the second barrier layer 671_2, such that the sidewall 671_2c of the second barrier layer 671_2 have a substantially vertical profile. However, at least a portion of the bottom surface 671_2a of the second barrier layer 671_2 will contact the liner layer 175.

Figure 19:
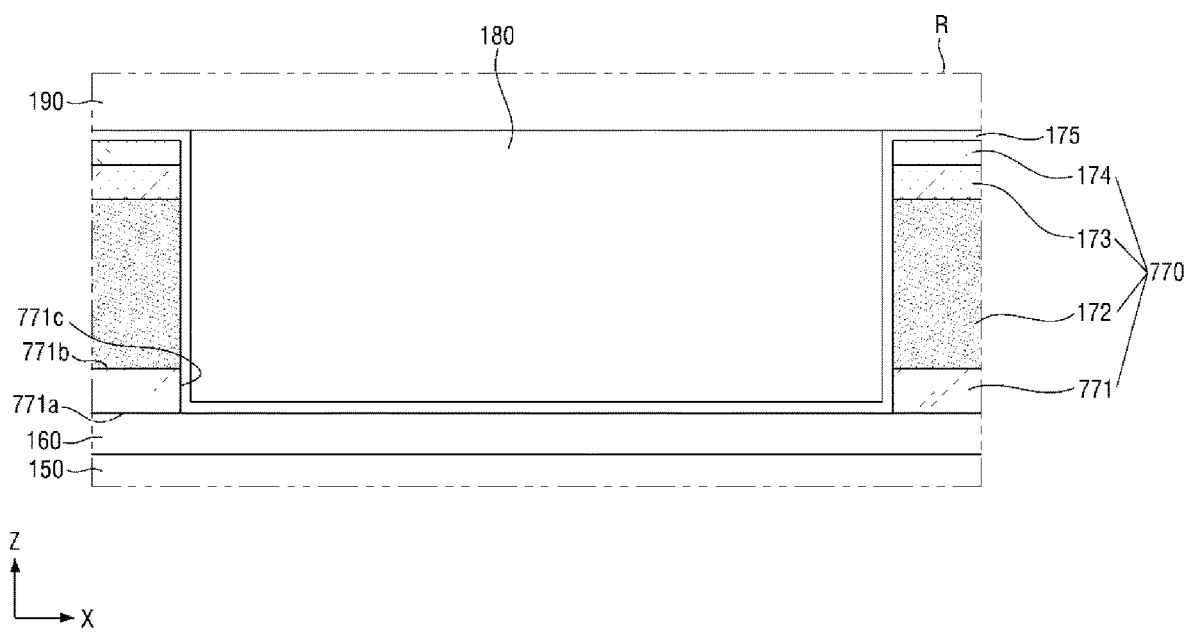

FIG. 19 is a cross-sectional view of an image sensor according to embodiments of the present disclosure.

Referring to FIG. 19, a barrier layer 771 may be formed as a single-layer film. The barrier layer 771 may be formed from (e.g.,) tungsten W.

A first lateral width of a bottom surface 771a of the barrier layer 771 may be the same as the lateral width of a top surface 771b of the barrier layer 771, such that sidewall 771c of the barrier layer 771 have a substantially vertical profile, where a vertical alignment may exist between the sidewall 771c of the barrier layer 771 and sidewall of the fence structures 770.

Figure 20:
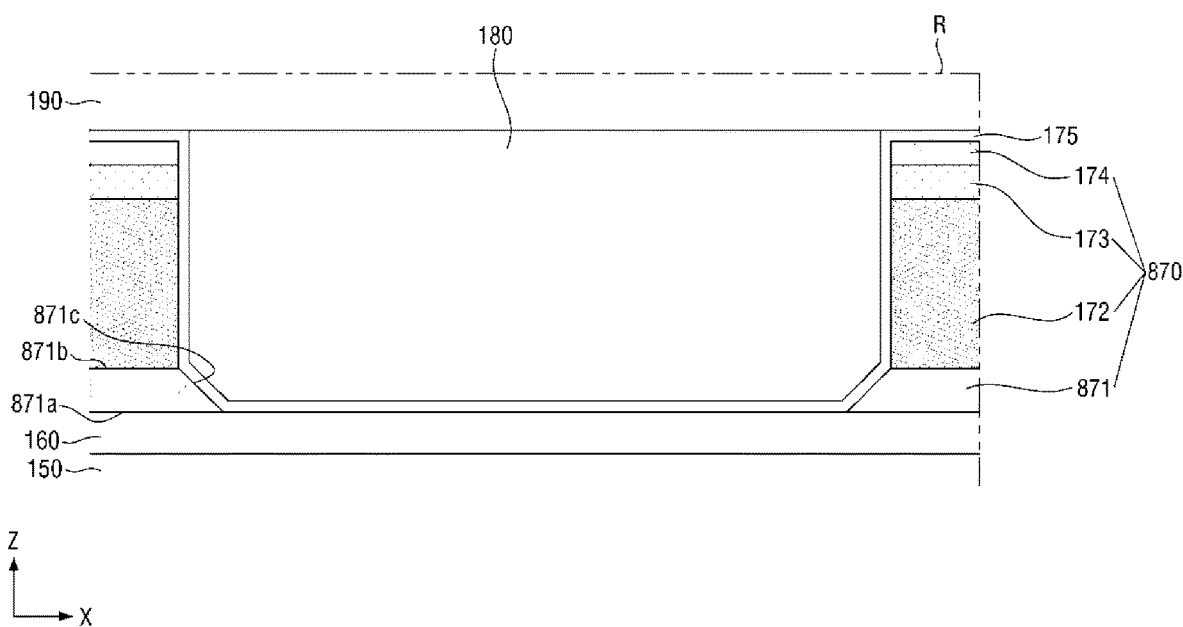

FIG. 20 is a cross-sectional view of an image sensor according to embodiments of the present disclosure.

Referring to FIG. 20, a barrier layer 871 may be formed as a single-layer film (of e.g., tungsten W). However, the barrier layer 871 may include an inward lateral protrusion relative to the sidewall of fence structures 870.

Hence, a first lateral width of a bottom surface 871a of the barrier layer 871 may be greater than a second lateral width of a top surface 871b of the barrier layer 871. Thus, sidewall 871c of the inwardly protruding barrier layer 871 may have an inclined or angular profile with respect to the sidewall of fence structures 870.

Figure 21:
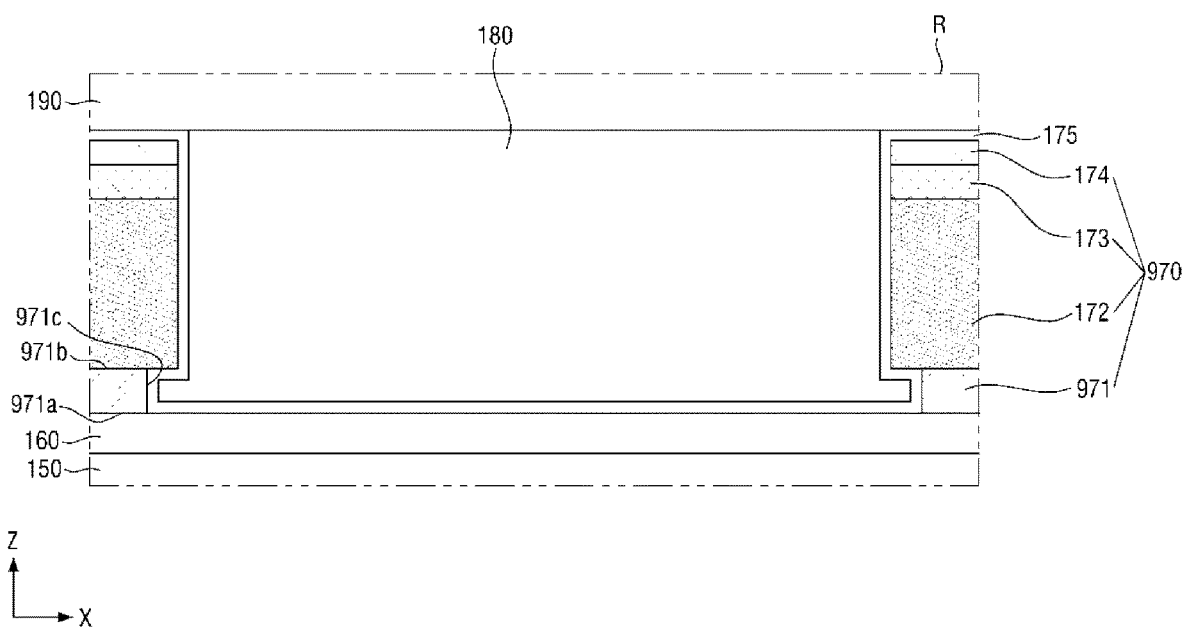

FIG. 21 is a cross-sectional view of an image sensor according to embodiments of the present disclosure.

Referring to FIG. 21, a barrier layer 971 may be formed as a single-layer film (of e.g., tungsten W), wherein the barrier layer 971 may be outwardly recessed with respect to the sidewall of fence structures 970.

Thence, a first lateral width of a bottom surface 971a of the barrier layer 971 may be the same as the lateral width of a top surface 971b of the barrier layer 971, such that the sidewall 971c of the barrier layer 971 have a substantially vertical profile. As a result, a bottom surface of a low refractive index layer 172 may be at least partially in contact with the liner layer 175.

While embodiments are described above, it is not intended that these embodiments describe all possible forms of the inventive concept of the present disclosure. Rather, the words used in the specification are words of description rather than limitation, and it is understood that various changes may be made without departing from the spirit and scope of the inventive concept of the present disclosure. Additionally, the features of various implementing embodiments may be combined to form further embodiments of the present disclosure.

What is claimed is:

1. An image sensor comprising:
   a photoelectric conversion element disposed in a substrate;
   a fence structure disposed on the substrate and including a low refractive index layer stacked on a barrier layer, wherein the barrier layer includes at least one metal; and
   a color filter disposed inwardly lateral with respect to a sidewall of the fence structure,
   wherein the barrier layer includes an outward lateral stepped recess that underlays at least a portion of the fence structure.

2. The image sensor of claim 1, wherein the fence structure includes a mask layer disposed on the low refractive index layer.

3. The image sensor of claim 2, wherein the fence structure includes a penetration prevention layer disposed between the low refractive index layer and the mask layer, and
   a thickness of the penetration prevention layer ranges from between 50 nm to 150 nm.

4. The image sensor of claim 1, wherein a top surface of the fence structure is formed lower than a top surface of the color filter.

5. The image sensor of claim 1, wherein a top surface of the fence structure is formed at a vertical plane lower than a top surface of the color filter.

6. The image sensor of claim 1, wherein the barrier layer includes a first barrier layer formed from a first metal and disposed on the substrate, and a second barrier layer formed from a second metal different from the first metal and disposed on the first barrier layer.

7. The image sensor of claim 6, wherein a first lateral width of a bottom surface of the first barrier layer is greater than a second lateral width of a top surface of the first barrier layer, and a sidewall of the first barrier layer has an angular profile,
   a third lateral width of a bottom surface of the second barrier layer is the same as a lateral width of a top surface of the second barrier layer, and a sidewall of the second barrier layer has a vertical profile aligned with the sidewall of the fence structure, and
   the sidewall of the first barrier layer provides an angular lateral recess as the outward lateral stepped recess underlying a portion of the second barrier layer.

8. The image sensor of claim 7, further comprising:
   a liner layer disposed on a top surface of the fence structure, the sidewall of the fence structure, and in the angular lateral recess to contact at least a portion of the bottom surface of the second barrier layer.

9. The image sensor of claim 6, wherein a first lateral width of a bottom surface of the first barrier layer is greater than a second lateral width of a top surface of the first barrier layer, and a sidewall of the first barrier layer has an angular profile,
   a third lateral width of a bottom surface of the second barrier layer is greater than the first lateral width of the bottom surface of the first barrier layer, is the same as a lateral width of a top surface of the second barrier layer, and a sidewall of the second barrier layer has a vertical profile, and
   the sidewall of the first barrier layer provides an angular lateral recess as the outward lateral stepped recess underlying a portion of the second barrier layer.

10. The image sensor of claim 9, further comprising:
a liner layer disposed on a top surface of the fence structure, the sidewall of the fence structure, on at least a portion of the top surface of the second barrier layer, and in the angular lateral recess to contact at least a portion of the bottom surface of the second barrier layer.

11. The image sensor of claim 10, wherein an uppermost surface of the liner layer is formed at a same vertical plane as a top surface of the color filter.

12. An image sensor comprising:
a photoelectric conversion element disposed in a substrate;
a fence structure disposed on the substrate and including a low refractive index layer stacked on a barrier layer, wherein the barrier layer includes at least one metal; and
a color filter disposed inwardly lateral with respect to a sidewall of the fence structure,
wherein the barrier layer includes a composite lateral protrusion including a first lateral protrusion and a second lateral protrusion,
the barrier layer includes a first barrier layer formed from a first metal and disposed on the substrate, and a second barrier layer formed from a second metal different from the first metal and disposed on the first barrier layer,
a first lateral width of a bottom surface of the first barrier layer is greater than a second lateral width of a top surface of the first barrier layer, and a sidewall of the first barrier layer has an angular profile to form the first lateral protrusion, and
a third lateral width of a bottom surface of the second barrier layer is less than the second lateral width of the top surface of the first barrier layer and greater than a fourth lateral width of a top surface of the second barrier layer, and a sidewall of the second barrier layer has an angular profile to form the second lateral protrusion.

13. The image sensor of claim 12, further comprising:
a liner layer disposed on a top surface of the fence structure, the sidewall of the fence structure, the sidewall of the first barrier layer, and the sidewall of the second barrier layer.

14. The image sensor of claim 12, wherein a fifth lateral width of the fence structure is less than the fourth lateral width of the top surface of the second barrier layer.

15. The image sensor of claim 14, further comprising:
a liner layer disposed on a top surface of the fence structure, the sidewall of the fence structure, a portion of the top surface of the second barrier layer, the sidewall of the second barrier layer, a portion of the surface of the first barrier layer, and the sidewall of the first barrier layer.

16. An image sensor comprising:
a photoelectric conversion element disposed in a substrate;
a fence structure disposed on the substrate and including a low refractive index layer stacked on a barrier layer, wherein the barrier layer includes a first barrier layer disposed on the substrate, and a second barrier layer disposed on the first barrier layer; and
a color filter disposed inwardly lateral with respect to a sidewall of the fence structure,
wherein the barrier layer includes an outward lateral stepped recess that underlays at least a portion of the fence structure.

17. The image sensor of claim 16, wherein a bottom surface of the first barrier layer and a top surface of the first barrier layer have a first lateral width, and a sidewall of the first barrier layer has a vertical profile,
a bottom surface of the second barrier layer and a top surface of the second barrier layer have a second lateral width, and a sidewall of the second barrier layer has a vertical profile, and
the first lateral width is less than the second lateral width.

18. The image sensor of claim 17, further comprising:
a liner layer disposed on a top surface of the fence structure, the sidewall of the fence structure, the sidewall of the first barrier layer, and the sidewall of the second barrier layer,
wherein the liner layer conformally fills at least a portion of the outward lateral stepped recess.

* * * * *